(12) United States Patent
Arulraj et al.

(10) Patent No.: US 10,416,963 B2
(45) Date of Patent: Sep. 17, 2019

(54) BOUNDS CHECKING (71) Applicant: ARM Limited, Cambridge (GB)

(72) Inventors: Daniel Arulraj, Austin, TX (US);
Graeme Peter Barnes, Cambridge (GB); Lee Eisen, Austin, TX (US); Gary Gorman, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/626,454

(22) Filed: Jun. 19, 2017

(65) Prior Publication Data
US 2018/0364980 A1    Dec. 20, 2018

(51) Int. Cl.
*G06F 7/02*     (2006.01)
*G06F 7/50*     (2006.01)
*G06F 3/06*     (2006.01)
*G06F 12/14*    (2006.01)
*H03M 7/24*     (2006.01)
*H03M 7/30*     (2006.01)

(52) U.S. Cl.
CPC .............. *G06F 7/50* (2013.01); *G06F 3/0622* (2013.01); *G06F 3/0638* (2013.01); *G06F 3/0673* (2013.01); *G06F 7/02* (2013.01); *G06F 12/1416* (2013.01); *H03M 7/24* (2013.01); *H03M 7/30* (2013.01); *H03M 7/3066* (2013.01); *H03M 7/3091* (2013.01); *H03M 7/702* (2013.01); *G06F 2212/1052* (2013.01)

(58) Field of Classification Search
CPC .............. G06F 7/02; G06F 7/026; G06F 7/06
See application file for complete search history.

(56) References Cited

U.S. PATENT DOCUMENTS 5,325,496 A      6/1994   Hays et al.
8,914,431 B2 *  12/2014   Carlough .............. G06F 7/5375
                                                  708/504
(Continued)

FOREIGN PATENT DOCUMENTS

CN    101256480    9/2008
CN    101833631    9/2010

OTHER PUBLICATIONS

International Search Report and Written Opinion of the International Searching Authority dated Sep. 7, 2018 in PCT/GB2018/051661, 13 pages.
(Continued)

*Primary Examiner* — Chuong D Ngo
(74) *Attorney, Agent, or Firm* — Nixon & Vanderhye P.C.

(57) ABSTRACT

A data processing apparatus is provided, for performing a determination of whether a value falls within a boundary defined by a lower limit between 0 and $2^m$ and an upper limit between 0 and $2^m$. The apparatus includes storage circuitry that stores each of the lower limit and the upper limit in a compressed form as a mantissa of q<m bits and a shared exponent e. A most significant m-q-e bits of said lower limit and said upper limit are equal to a most significant m-q-e bits of said value. Adjustment circuitry performs adjustments to the lower limit and the upper limit in compressed form and boundary comparison circuitry performs the determination on the value using the lower limit and the upper limit in the compressed form.

21 Claims, 8 Drawing Sheets

(56) References Cited

U.S. PATENT DOCUMENTS

| | | | |
|---|---|---|---|
| 2005/0086279 A1* | 4/2005 | Dhong | G06F 7/026 |
| | | | 708/700 |
| 2005/0210093 A1* | 9/2005 | Hinds | G06F 7/026 |
| | | | 708/495 |
| 2011/0099429 A1 | 4/2011 | Varma et al. | |
| 2016/0147466 A1 | 5/2016 | Yazdani et al. | |

OTHER PUBLICATIONS

A. Kwon et al, "Low-Fat Pointers: Compact Encoding and Efficient Gate-Level Implementation of Fat Pointers for Spatial Safety and Capability-based Security" CCS'13, Nov. 4-8, 2013, 12 pages.

P. Akritidis et al, "Baggy Bounds Checking: An Efficient and Backwards-Compatible Defense against Out-of-Bounds Errors" Aug. 2009, 16 pages.

N.P. Carter et al, "Hardware Support for Fast Capability-based Addressing" *Proceedings of the 6th International Conference on Architectural Support for Programming Languages and Operating Systems (ASPLOS VI)*, Oct. 1994, 10 pages.

* cited by examiner

FIG. 3 upperm = 0x10000
lowerm = 0xFF000
ptr = 0x00000000_000FFF00
exp = 0x000000
offset = 0x00...00001
q + e = 20 + 0 = 20

Thus,
repm = 0xFF000 − 0x01000 = 0xFE000
ptrm = (ptr >> exp)[19:0] = ptr[19:0] = 0xFFF00 upper bounds wrapping:
  ptrm >= repm : 0xFFF00 >= 0xFE000  Yes, So
upperm >= repm : 0x10000 >= 0xFE000  No

BOUNDS CHECKING

TECHNICAL FIELD

The present disclosure relates to bounds checking. Purely for example, the present disclosure might be of relevance to memory bounds checking.

DESCRIPTION

It is often desirable to determine whether one value lies within a boundary defined by a lower limit and an upper limit. For example, in memory systems, memory can be divided into a number of regions, with a different process "owning" a particular memory region. For reasons of security, it is often desirable to prevent a non-owning process from accessing the memory region than is owned by another process. To do this, an attempt to access memory should be bounds-checked in order to check whether the access is within the memory access region belonging to the currently executing process. As memory systems become bigger, the size of memory addresses also increases. This therefore increases the number of bits needed to express not only the memory location to be accessed, but also the lower limit of the memory region and the upper limit of the memory region. This in turn increases circuitry size and therefore power consumption. Still furthermore, comparing such a large number of bits becomes time consuming. It would therefore be desirable to perform such a determination in less time and ideally using smaller circuits.

SUMMARY

Viewed from a first example configuration, there is provided a data processing apparatus to perform a determination of whether a value falls within a boundary defined by a lower limit between 0 and $2^m$ and an upper limit between 0 and $2^m$, comprising: storage circuitry to store each of said lower limit and said upper limit in a compressed form as a mantissa of $q<m$ bits and a shared exponent e, wherein a most significant m-q-e bits of said lower limit and said upper limit are equal to a most significant m-q-e bits of said value; adjustment circuitry to perform adjustments to said lower limit and said upper limit in compressed form; and boundary comparison circuitry to perform said determination on said value using said lower limit and said upper limit in said compressed form.

Viewed from a second example configuration, there is provided a method of operating a data processing apparatus to perform a determination of whether a value falls within a boundary defined by a lower limit between 0 and $2^m$ and an upper limit between 0 and $2^m$, comprising: storing each of said lower limit and said upper limit in a compressed form as a mantissa of $q<m$ bits and a shared exponent e, wherein a most significant m-q-e bits of said lower limit and said upper limit are equal to a most significant m-q-e bits of said value; performing adjustments to said lower limit and said upper limit in compressed form; and performing said determination on said value using said lower limit and said upper limit in said compressed form.

Viewed from a third example configuration, there is provided a method of operating a data processing apparatus to perform a determination of whether a value falls within a boundary defined by a lower limit between 0 and $2^m$ and an upper limit between 0 and $2^m$, comprising: means for storing each of said lower limit and said upper limit in a compressed form as a mantissa of $q<m$ bits and a shared exponent e, wherein a most significant m-q-e bits of said lower limit and said upper limit are equal to a most significant m-q-e bits of said value; means for performing adjustments to said lower limit and said upper limit in compressed form; and means for performing said determination on said value using said lower limit and said upper limit in said compressed form.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Before discussing the embodiments with reference to the accompanying figures, the following description of embodiments is provided.

In accordance with one example configuration there is provided a data processing apparatus to perform a determination of whether a value falls within a boundary defined by a lower limit between 0 and $2^m$ and an upper limit between 0 and $2^m$, comprising: storage circuitry to store each of said lower limit and said upper limit in a compressed form as a mantissa of $q<m$ bits and a shared exponent e, wherein a most significant m-q-e bits of said lower limit and said upper limit are equal to a most significant m-q-e bits of said value; adjustment circuitry to perform adjustments to said lower limit and said upper limit in compressed form; and boundary comparison circuitry to perform said determination on said value using said lower limit and said upper limit in said compressed form.

In accordance with the above, each of the lower limit and the upper limit is stored in a compressed form. In this way, the lower limit and the upper limit are expressed as a mantissa made up from q bits (where q is less than m). The lower limit and the upper limit also share an exponent e, which is an integer greater than or equal to zero. Consequently, the lower limit corresponds with the value of the mantissa for the lower limit multiplied by $2^e$ and the upper limit corresponds with the mantissa of the upper limit multiplied by $2^e$. In each case, after performing the multiplication by $2^e$, the high (m-q-e) bits of the pointer are added to produce the full upper limit and lower limit of size m (e.g. 64). This, for example, allows each of the lower limit and the upper limit to be expressed as a mantissa of 20 bits and for each of the lower limit and the upper limit to share a single 5 bit exponent. In contrast, in a typical 64 bit system, each of the upper limit and the lower limit may each require 64 bits of storage, giving a total of 128 bits. The adjustment circuitry performs an adjustment on the lower limit and the upper limit whilst in compressed form. The result of the adjustment is then passed to the boundary comparison circuitry that performs the determination of whether the value falls within the boundary defined by the lower limit and the upper limit. This determination is performed without decompressing or expanding the lower limit or upper limit. Consequently, the circuitry that performs the determination can operate more quickly and potentially using fewer components (thereby reducing power consumption) than other systems.

In some embodiments, said storage circuitry is configured to store a base; and said value is derived by adding together said base and an offset. Consequently, the value may be made up of a base and an offset. The offset could be varied over a number of iterations in order to perform a number of different comparisons each starting from the same base number. Note that the offset could be negative. In this case, the value may still be derived by adding together the base and the offset. However, one of ordinary skill in the art will appreciate that this is mathematically the same as subtracting the offset from the base. In some embodiments, the storage circuitry could also store the offset. The offset might be stored separately from the base. For example one register could store the base and another register could store the offset.

In some embodiments, said boundary comparison circuitry performs said determination using boundary wrapping with (q+1) bits of said value, said lower limit, and said upper limit. Boundary wrapping is a technique in which a window of values is considered. Provided each of the values to be compared falls within that window, it is possible to perform a relative comparison between those values even if the values themselves are projected into the window using only a subset of the full set of bits making up those values. If one or more of the values fall outside the window, the values can be adjusted such that they all fall within the window while maintaining the relative ordering thereof. In this way, it is possible to compare each of the values without necessarily considering the full set of bits that make up those values and still deliver a correct assessment of the boundary check.

In some embodiments, said adjustment circuitry is configured to determine a mantissa of said value by right shifting said value based on said exponent and then taking a least significant q bits. The adjustment circuitry determines the mantissa of the value firstly by right shifting the value based on the exponent. Having done this, a least significant q bits from the result of the write shifting is taken as the mantissa. Accordingly, the mantissa of the value will have the same number of bits as the mantissa of the lower limit and the upper limit. In some embodiments, the mantissa of the value is initially produced by right shifting a number of times equal to the exponent. Consequently, the mantissa of the value that is generated by the adjustment circuitry will be in alignment with the mantissa of the lower limit and the upper limit.

In some embodiments, said adjustment circuitry is configured to perform one or more of said adjustments in response to a determination of whether said mantissa of said lower limit, said mantissa of said upper limit, and said mantissa of said value are all within $2^{q+e}$ of each other. The adjustments may therefore be dependent on whether the smallest of the mantissa of the lower limit, the mantissa of the upper limit, and the mantissa of the value when added to the value $2^{q+e}$ is greater than the largest of the mantissa of the lower limit, the mantissa of the upper limit, and the mantissa of the value. In other words, there exists a window of size $2^{q+e}$ that contains each of the mantissa of the lower limit, the mantissa of the upper limit, and the mantissa of the value.

In some embodiments, said adjustment circuitry is configured to increment or decrement at least one of said mantissa of said lower limit, said mantissa of said upper limit, and said mantissa of said value such that said mantissa of said lower limit, said mantissa of said upper limit, and said mantissa of said value are all within $2^{q+e}$ of each other. The adjustment performed by the adjustment circuitry may involve incrementing or decrementing any of the mantissa of the lower limit, the mantissa of the upper limit, and the mantissa of the value. Once the adjustments have been performed, each of the mantissa of the lower limit, the mantissa of the upper limit, and the mantissa of the value will fall within a window of size $2^{q+e}$.

In some embodiments, said adjustment circuitry is configured to increment or decrement at least one of said mantissa of said lower limit, said mantissa of said upper limit, and said mantissa of said value by $2^{q+e}$. The value by which the adjustment circuitry increments or decrements any of the mantissa of the lower limit, the mantissa of the upper limit, and the mantissa of the value may be equal to $2^{q+e}$. In some embodiments, the value by which incrementing or decrementing occurs will be the same for all of the adjustments carried out by the adjustment circuitry.

In some embodiments, said adjustment circuitry is configured to increment at least one of said mantissa of said lower limit, said mantissa of said upper limit, and said mantissa of said value such that said mantissa of said lower limit, said mantissa of said upper limit, and said mantissa of said value are all within $2^{q+e}$ of each other. Consequently, in such embodiments, the only adjustment performed by the adjustment circuitry in order to bring the mantissa of the lower limit, the mantissa of the upper limit, and the mantissa of the value to within a window of size $2^{q+e}$ is an incrementation operation. In other words, none of these mantissas are decremented. Note, that the term increment need not require a mathematical addition operation to be performed, in particular, in some embodiments, said adjustment circuitry is configured to increment at least one of said mantissa of said lower limit, said mantissa of said upper limit, and said mantissa of said value by performing a concatenation on at least one of said mantissa of said lower limit, said mantissa of said upper limit, and said mantissa of said value. In this way, an effective addition is performed by the performing a concatenation operation. A concatenation operation may be performed more easily and/or quickly than a strict addition operation, which may require the use of complex addition circuitry in order to perform the operation. Accordingly, by performing a concatenation operation rather than a strict addition operation, the adjustment performed by the adjustment circuitry may proceed more quickly, may use less circuitry, and may exhibit lower power consumption.

In some embodiments, said concatenation is of a value '1' at a most significant position, such that said concatenation is equivalent to adding $2^{q+e}$.

In some embodiments, said determination is made by considering a window of $2^{q+e}$ contiguous values starting at a representative value less than said mantissa of said lower limit. The above mentioned window that may be used on order to assess the relative positions of the lower limit, the value, and the upper limit (or the mantissas of those values) may be defined by a representative value. The representative value is set so that it is less than the mantissa of the lower limit. For example, in some embodiments, said representative value is equal to said mantissa of said lower limit minus $2^{12}$.

In some embodiments, said adjustment circuitry is configured to concatenate a '1' to most significant bits of said mantissa of said value in response to said mantissa of said value being less than said representative value. The adjustment performed by the adjustment circuitry may therefore involve concatenating a '1' to the most significant bits of the mantissa of the value. The concatenation of the '1' has the effect of adding the value $2^{q+e}$ to the mantissa of the value. This can be used to adjust the mantissa of the value such that it falls within the same $2^{q+e}$ window.

In some embodiments, said adjustment circuitry is configured to concatenate a '1' to most significant bits of said mantissa of said upper limit in response to said mantissa of said upper limit being less than said representative value. Again, a concatenation of a '1' to the most significant bits is equivalent to adding a value of $2^{q+e}$ to the upper limit. Consequently, the upper limit can be adjusted so that it falls within the same window of size $2^{q+e}$.

In some embodiments, said adjustment circuitry is configured to concatenate a '1' to most significant bits of said mantissa of said lower limit in response to said mantissa of said lower limit being less than said representative value. Once more, the concatenation of the '1' to the most significant bits of the mantissa of the lower limit is effectively the same as adding the value $2^{q+e}$ to the mantissa of the lower limit, thereby bringing the mantissa of the lower limit into the same window of size $2^{q+e}$.

In some embodiments, said storage circuitry is configured to store a base; said value is derived by adding together said base and an offset; said adjustment circuitry is configured to increment said mantissa of said value by 1 in response to said least significant (e−1) bits of adding together said base and said offset producing a carry. When the base and the offset are added together in order to produce the value (or when adding together a mantissa of the base and a mantissa of the offset in order to produce a mantissa of the value), the addition may result in a carry occurring. In order to compensate for this, the mantissa of the value is incremented by one.

In some embodiments, said boundary comparison circuitry comprises: edge-case circuitry to indicate that said value falls outside said boundary in response to one or more edge-case conditions; and mantissa comparison circuitry to indicate whether said value falls within said boundary based on said mantissa of said value being less than said mantissa of said lower limit or greater than said mantissa of said upper limit after said adjustments have been performed. The edge-case circuitry may be used in order to represent a number of edge-cases that occur during the analysis or comparison of the value with the lower limit and the upper limit. Accordingly, the edge-case circuitry may be used in order to indicate that the value falls outside the boundary even though the mantissa comparison circuitry might indicate that the value falls inside the boundary (and vice versa).

There are a number of examples of what such edge-case conditions may be. However, in some embodiments, said storage circuitry is configured to store a base; said value is derived by adding together said base and an offset; said edge-case conditions comprises a condition that most significant (m-e-q) bits of said offset contain at least one '1' and at least one '0'. The situation in which the most significant (m-e-q) bits of the offset contains at least one '1' and at least one '0' represents a situation in which the offset will cause the sum of the offset and the base to exceed the window size. Accordingly, the offset is large enough such that the boundary condition will be violated.

In some embodiments, said data processing apparatus operates in two or fewer processor cycles.

In some embodiments, said value, said lower limit, and said upper limit are pointers to addresses in a memory. For example, the data processing apparatus may form part of a memory access apparatus and the boundary may represent an area of memory that access is permitted. For example, access may be limited based on the currently executing process. In this way, it is possible to ensure that the process is not attempting to access a memory location outside its allowed area by checking the sum of the base and offset value to ensure that the result falls within the boundary defined by the lower limit and the upper limit.

Particular embodiments will now be described with reference to the figures.

Figure 1:
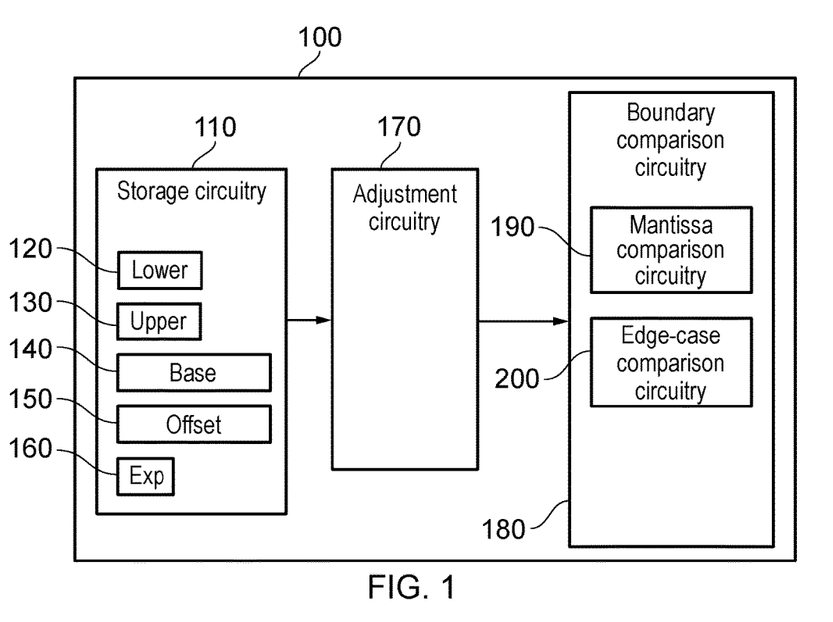
FIG. 1 illustrates a data processing apparatus in accordance with one embodiment.

FIG. 1 illustrates a data processing apparatus 100 in accordance with one embodiment. The data processing apparatus 100 includes storage circuitry 110 for storing the numbers for which checking is to be performed. In the present embodiment, integers are expressed as 64 bit numbers. A value, which is produced as a result of adding a base to an offset is checked to determine whether it falls within a boundary defined by a lower limit and an upper limit. However, rather than express and compare each of these numbers as a 64 bit number, some of the numbers are provided and compared in a compressed form, using fewer than 64 bits. Note that the offset could be zero, in which case the system determines with a given base value falls within the boundary defined by the upper and lower limits.

In particular, the storage circuitry 110 comprises lower limit storage circuitry 120 for storing a q (20) bit mantissa of the lower limit, and upper limit storage circuitry 130 for storing a q (20) bit mantissa of the upper limit. Each of the upper limit and lower limit share a 6 bit exponent e, which is stored in exponent storage circuitry 160. The base and the offset are each stored as full m (64) bit numbers in base storage circuitry 140 and offset storage circuitry 150 respectively. It will be appreciated, therefore, that fewer bits are required to store the lower limit and upper limit than if all 64 bits were stored. The upper limit is equal to: {value[63:n], upper[19:0], 0 . . . 0}, e.g. the concatenation of the upper 63-n bits of value, the q bits of the upper limit, and e zeros. Similarly, the lower limit is equal to: {value[63:n], lower[19:0], 0 . . . 0}, e.g. the concatenation of the upper 63-n bits of value, the q bits of the lower limit, and e zeros. In this way, the maximum expressible difference between the lower limit and the upper limit is $2^{q+e}$. The data processing device 100 stores the values in this form and uses various techniques in order to determine the boundary checking using the numbers in this compressed format. As a consequence, fewer bits need to be operated on, or stored, leading to lower storage requirements and faster comparisons. Effectively, the upper and lower limits are anchored by the pointer. The upper and lower limits therefore fall within a $2^{(q+e)}$ section where they share upper bits of the pointer. In this way, exact values for the upper and lower limits are not directly expressed, but instead derived by using the upper bits from the pointer value.

Adjustment circuitry 170 performs adjustments to one or more of the stored values as required before passing the modified values on to boundary comparison circuitry 180.

The adjustment circuitry 170 therefore provides compensation for the fact that only a small number of the full 64-bit values of the lower limit and the upper limit are being compared. The boundary comparison circuitry 180 takes the adjusted values in order to determine whether the value falls within the boundary defined by the lower limit and upper limit. The boundary comparison circuitry 180 is made up of three components. Mantissa comparison circuitry 190 is used to compare mantissas of the base, offset (if present), upper limit, and lower limit (as adjusted by the adjustment circuitry 170 in order to determine the result of the boundary checking. Edge-case comparison circuitry 200 considers one or more edge-case scenarios in which the mantissa comparison circuitry 190 may produce an incorrect result.

Figure 2:
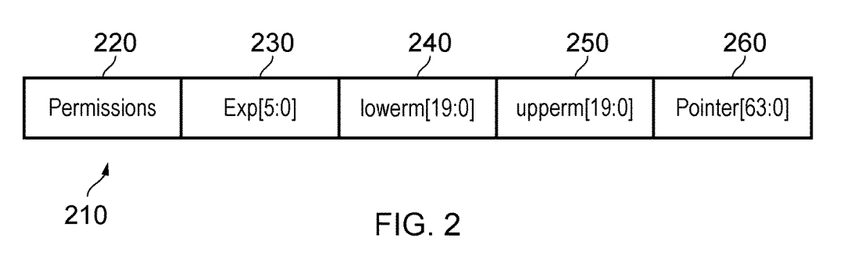
FIG. 2 illustrates an example of a fat pointer in accordance with one embodiment.

FIG. 2 illustrates an example of a fat pointer 210 that could be stored in a register file. A fat pointer 210 may be used in order to enforce memory protection. In particular, a memory could be divided into a number of regions, with different processes having different levels of access to each memory region. In this way, sensitive or secure data can be restricted to the processes associated with that data. This can also be used to inhibit malicious software from having a detrimental effect on a system. The fat pointer 210 is made up from a number of different data fields. These include a permissions data field 220, which may be used in order to implement a memory protection scheme. As above, the lower limit is formed by taking the lower limit mantissa 240 and left shifting it a number of times based on the exponent value 230 (filling with zeros). Upper bits of the lower limit are copied from the base (pointer) value 260, which indicates the memory address that is desired to be accessed. Similarly, the upper limit is formed in a similar way using the upper limit mantissa 250. The fat pointer 210 can be used to access the requested memory location and checked to ensure that it falls within the particular memory region. The offset value, which can be used to calculate a memory address to be accessed, is stored in another register in the register file. The register file can store anywhere from 16 to 32+ entries.

As previously explained, the maximum expressible difference between the lower limit and the upper limit is $2^{q+e}$. This is because there are q bits in the mantissas, and each of the mantissas are shifted according to the exponent value e.

Figure 3:
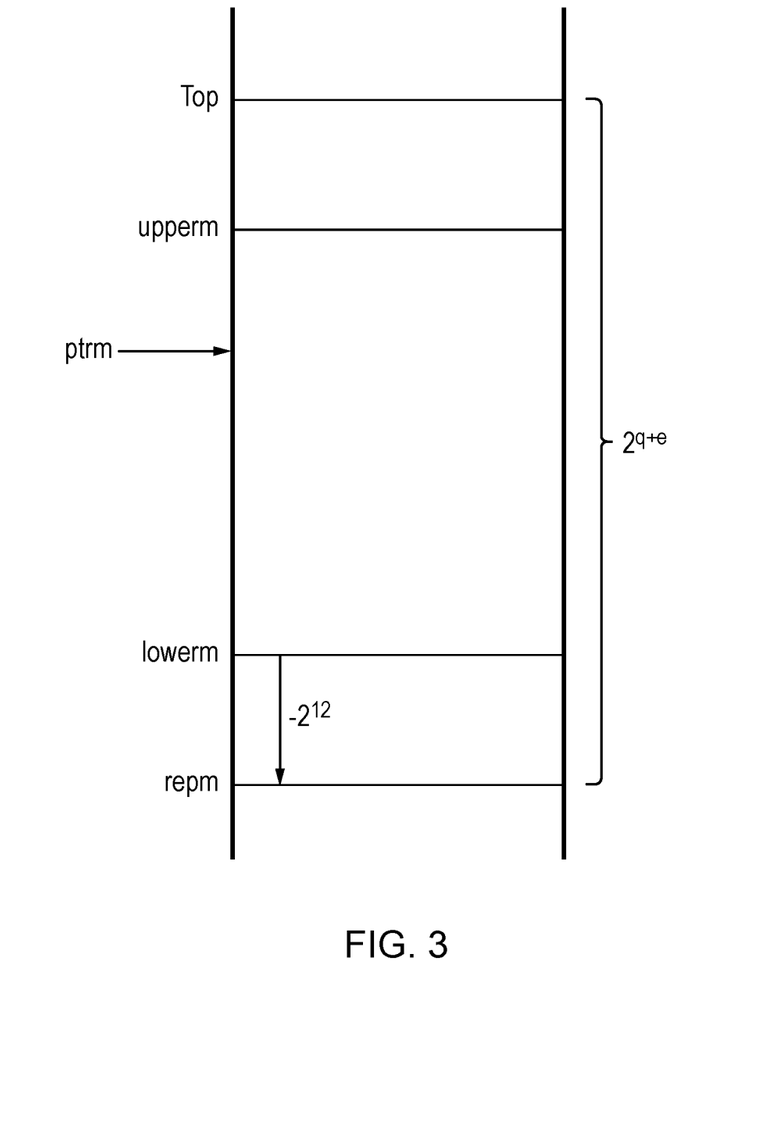
FIG. 3 shows the relationship between the upper mantissa (upperm), lower mantissa (lowerm), and base/pointer mantissa (ptrm)

FIG. 3 shows the relationship between the upper mantissa (upperm), lower mantissa (lowerm), and base/pointer mantissa (ptrm). The base/pointer mantissa is determined by the equation:

ptrm=(Pointer>>exp)[$q$:0]

As previously explained, the maximum expressible difference between the lower limit and the upper limit is $2^{q+e}$, because that that is the maximum area that can be expressed by examining the subset of bits (q+e bits rather than m bits) that are being accessed. If one of the limits or base/pointer value falls outside this range, then it could appear smaller. For example, consider the situation in which the window of size $2^{q+e}$ starts at a value 0, with the lower limit having a value of 10. In this case, the upper limit might have the value $2^{q+e}+1$. For an example value of q=8 and e=0, the upper limit of $2^{q+e}+1=257=(100000001)_2$ is strictly bigger than the lower limit of $10=(1010)_2$. However, if we can only examine the first 8 bits (q+e) of the upper limit, then the lower limit will still appear as $(00001010)_2$, but the upper limit will appear as $(00000001)_2=1$, i.e. smaller. To handle this situation, we perform boundary wrapping. In particular, we take a representative point (repm). In this embodiment, the representative point is obtained by taking the lower limit and subtracting $2^{12}$. However, other embodiments will consider other values. This then defines the start of the window of size $2^{q+e}$. Depending on the relationship of the different values to the representative point, adjustments can be made (e.g. by adjustment circuitry 170) to compensate for a number appearing smaller than it should.

Figure 4A:
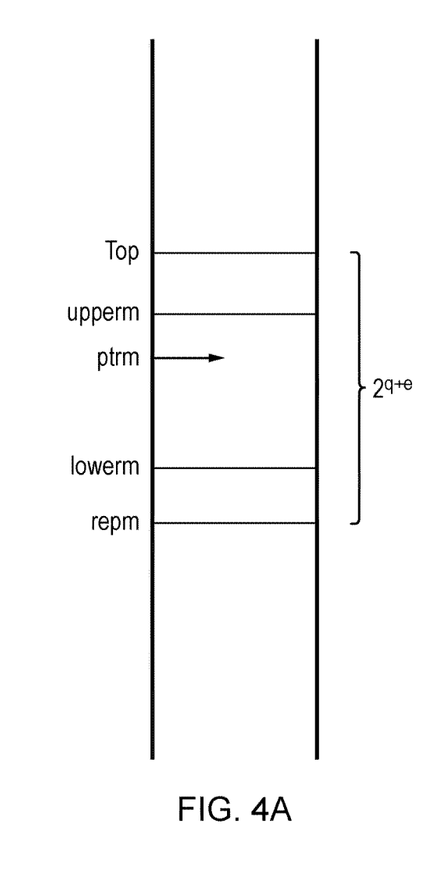
FIGS. 4A, 4B, and 4C show three different relationships between the mantissas and details how the adjustment circuitry compensates for these relationships.
Figure 4B:
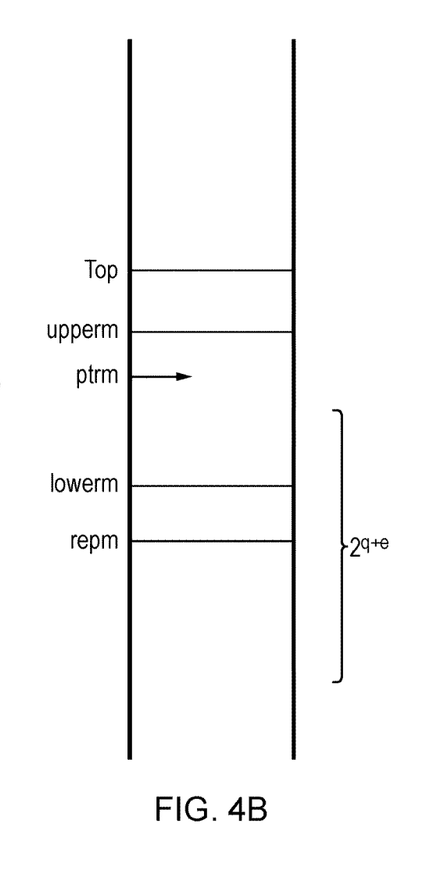
Figure 4C:
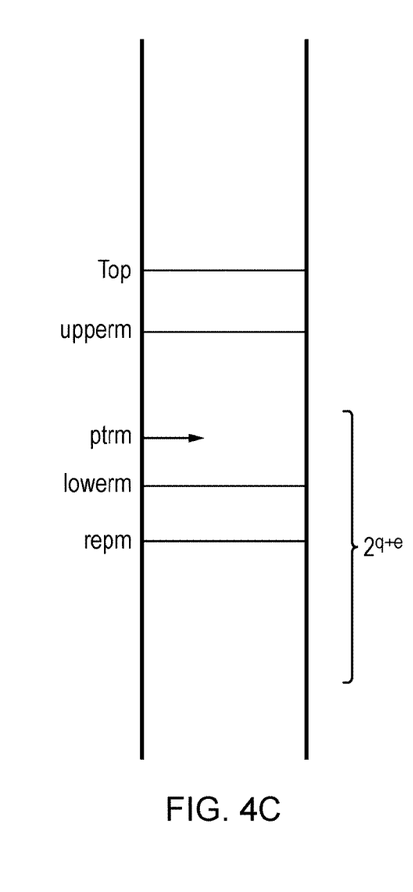

FIGS. 4A, 4B, and 4C show three different situations and detail how the adjustment circuitry 170 compensates for these situations. In particular, there are three different adjustments that can be made, each with a different condition. In particular:

If ptrm>=repm,then add $2^{q+e}$ to lowerm

If lowerm>=repm then subtract $2^{q+e}$ to lowerm

If ptrm>=repm then add $2^{q+e}$ to upperm

If upperm>=repm then subtract $2^{q+e}$ to upperm

In FIG. 4A, the base/pointer does not cross the $2^{q+e}$ boundary. Accordingly, no overall adjustment needs to be made. In particular, from a simple visual inspection it is clear that ptrm>=repm, lowerm>=repm, ptrm>=repm, and upperm>=repm. Accordingly, all of the conditions are met and so overall, no adjustment is made to any of the mantissas.

In FIG. 4B, the base/pointer does cross the $2^{q+e}$ boundary. In particular, note that ptrm is only slightly above the $2^{q+e}$ boundary. Accordingly, in its compressed form, ptrm will have a small value such that ptrm<repm, but lowerm>=repm. Since, logically, the pointer cannot really be less than lower limit, there a boundary adjustment must be made by decrementing lowerm by $2^{q+e}$. Meanwhile, ptrm<repm and upperm<repm so no adjustment is made to upperm.

In FIG. 4C, the base/pointer again crosses the $2^{q+e}$ boundary. In this case, note that the base/pointer is at the very top of one of the $2^{q+e}$ boundaries. Accordingly, in its compressed form, ptrm will have a very large value. In this case, ptrm>=repm, and lowerm>=repm, so no adjustment is made to lowerm. Meanwhile, ptrm>=repm, but upperm<repm. Since, logically, the pointer cannot really be greater than the upper limit, there is a boundary adjustment that must be made. Therefore, the overall effect is to increment upperm by $2^{q+e}$.

As an alternative to both incrementing and decrementing, it is possible to only perform addition. In particular, rather than decrementing one of the mantissas, one can simply increment both of the other mantissas. Consequently, the above rules can be adapted to:

If ptrm<repm,increment ptrm by $2^{q+e}$

If upperm<repm,increment upperm by $2^{q+e}$

If lowerm<repm,increment lowerm by $2^{q+e}$

As a further improvement, rather than actually performing an addition, a simpler solution is to simply concatenate a '1' to the front of the mantissa value. Since the mantissa value is q bits in length and since the exponent associated with the mantissa is e, concatenating a '1' to the front of the mantissa value is equivalent to adding $2^{q+e}$.

Having adjusted the mantissa values as explained above, it is a simple manner of comparing the adjusted values to determine whether the boundary check is met. Firstly, the offset mantissa value is calculated in a similar way to that of the base/pointer mantissa value:

offsetm=(Offset>>exp)[$q$:0]

The offset mantissa value and base/pointer mantissa value are then added together. The result is then compared to the boundary defined by the lower limit mantissa and the upper limit mantissa. This determination is made by the mantissa comparison circuitry 190, which returns the result of the check. If the result is positive then the access is allowable because the address defined the pointer+offset will fall within the boundary defined by the upper and lower limits.

Two edge cases exist, one of which can be handled by the adjustment circuitry 170 and one that can be handled by the edge-case comparison circuitry 200.

Firstly, if at least one but not all of the high bits (bits [63:q+e]) of the offset value (offset_hi) are one (high_offset_bits_fail), then the check should fail. This is because if some of those bits are ones then the offset will attempt to move the pointer value more than $2^{q+e}$ bits. Since this is the maximum expressible size of the boundary, such an offset will inherently move the pointer outside the boundary. Note that if all of the high bits are ones then the offset is negative. This is allowed and need not move the pointer outside the boundary. This check can be performed by the edge-case comparison circuitry.

Secondly, if the low bits (bits [e−1:0]) of the offset value (offset_lo) involve a carry (low_carry) then ptrm must be incremented by 1 before performing the boundary check. This can be performed by the adjustment circuitry 170.

Figure 5:
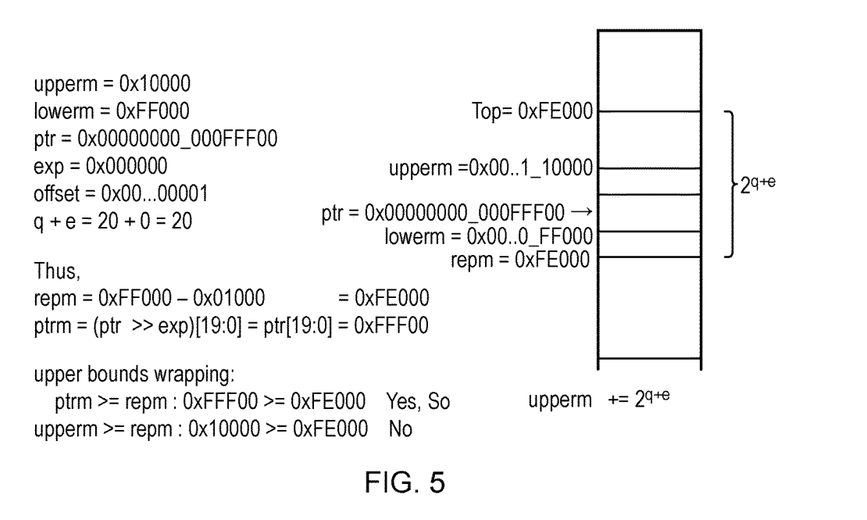
FIG. 5 shows a worked example of modifying the mantissas in accordance with one embodiment.

FIG. 5 shows a worked example. The upper mantissa and lower mantissa are $(0x10000)_{16}$ and $(0xFF000)_{16}$ respectively. The pointer mantissa is determined using the formula described above, which produces the value $(0xFFF00)_{16}$. Similarly, the representative point is produced by subtracting $2^{12}$ from the base mantissa to give $(0xFE000)_{16}$. From these numbers, it will immediately become clear that the value upper limit clearly falls into a different boundary of $2^{q+e}$, and therefore must be adjusted by adding $2^{q+e}$ to the mantissa value.

Figure 6:
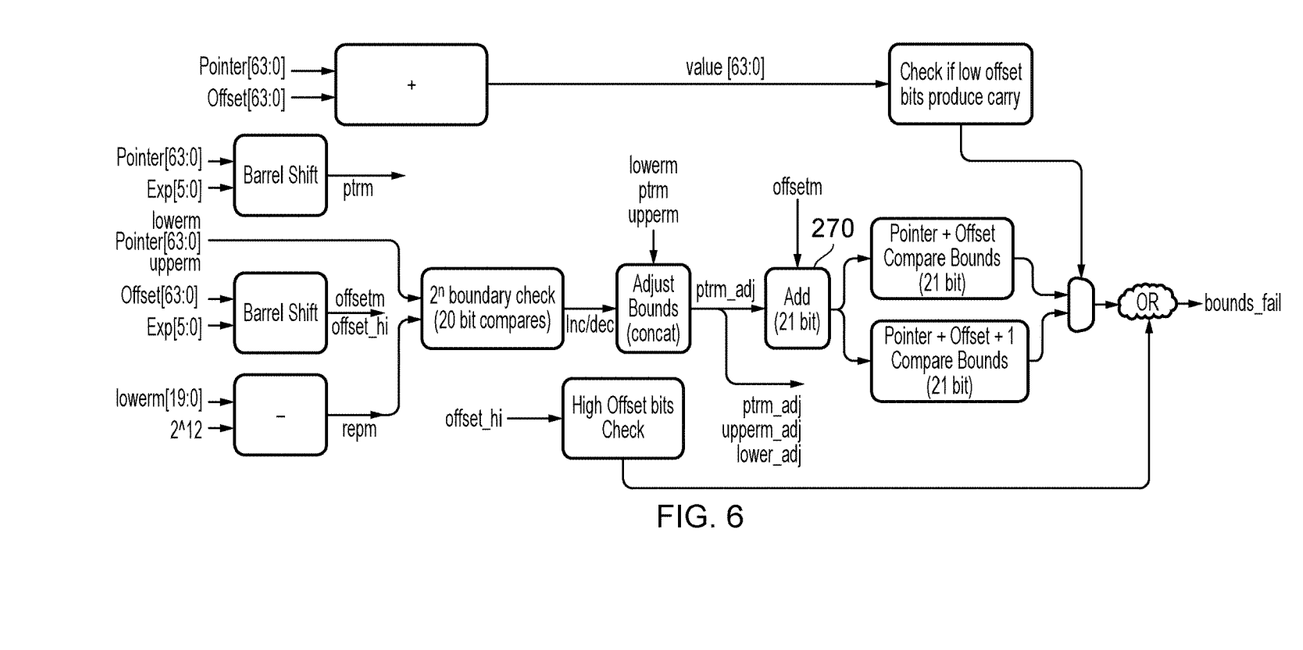
FIG. 6 schematically shows example circuitry for performing the present technique in accordance with one embodiment.

FIG. 6 schematically shows example circuitry for performing the present technique in accordance with one embodiment. This requires a single 21 bit adder 270. In contrast, a technique that involves fully expanding the limits to compare to the value would require 64 bit barrel shifters and adders. Consequently, the present technique can be implemented more efficiently than other techniques.

Figure 7:
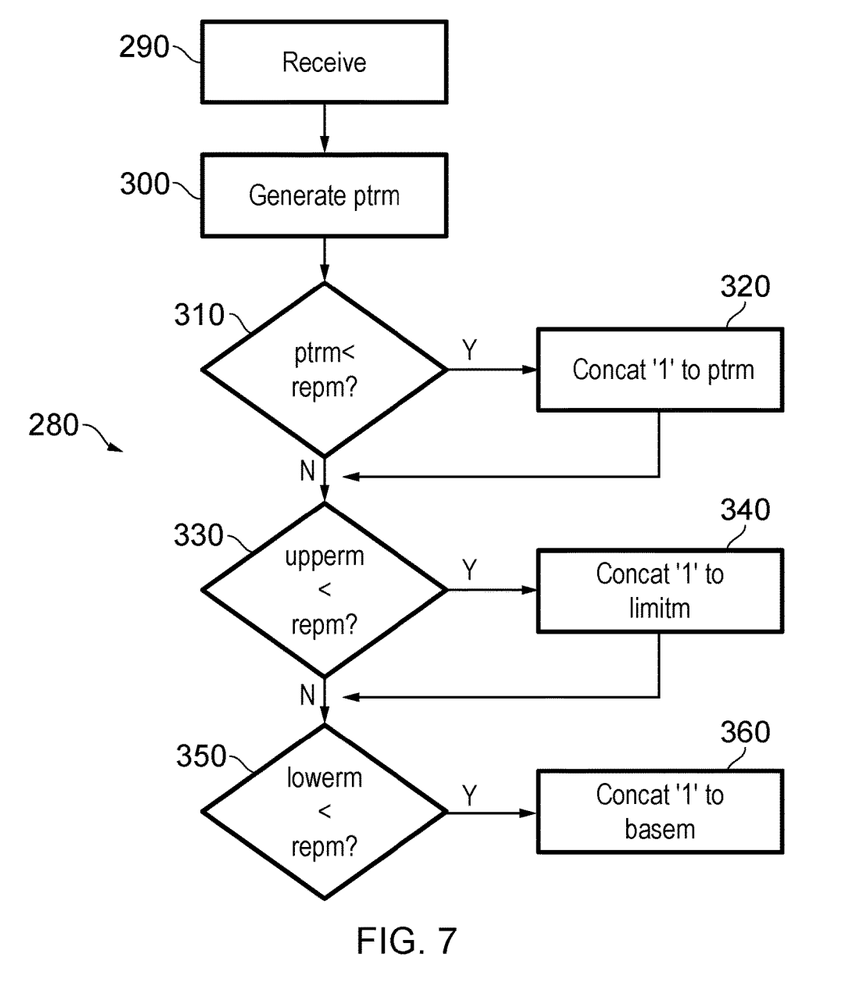
FIG. 7 shows a flowchart that illustrates the behaviour of the adjustment circuitry in adjusting mantissa values prior to being provided to the boundary comparison circuitry in accordance with one embodiment.

FIG. 7 shows a flowchart 280 that illustrates the behaviour of the adjustment circuitry 170 in adjusting mantissa values prior to being provided to the boundary comparison circuitry 180 in accordance with one embodiment. In a step 290, upperm and lowerm are received. In a step 300, ptrm is generated from the pointer value as previously discussed. At step 310, it is determined whether ptrm<repm. If so, then at step 320, a '1' is concatenated to the front of ptrm. In either event at step 330, it is determined whether upperm<repm. If so, then at step 340, a '1' is concatenated to the front of limitm. In any event, at step 350, it is determined whether lowerm<repm. If so, then at step 360, a '1' is concatenated to basem.

Figure 8:
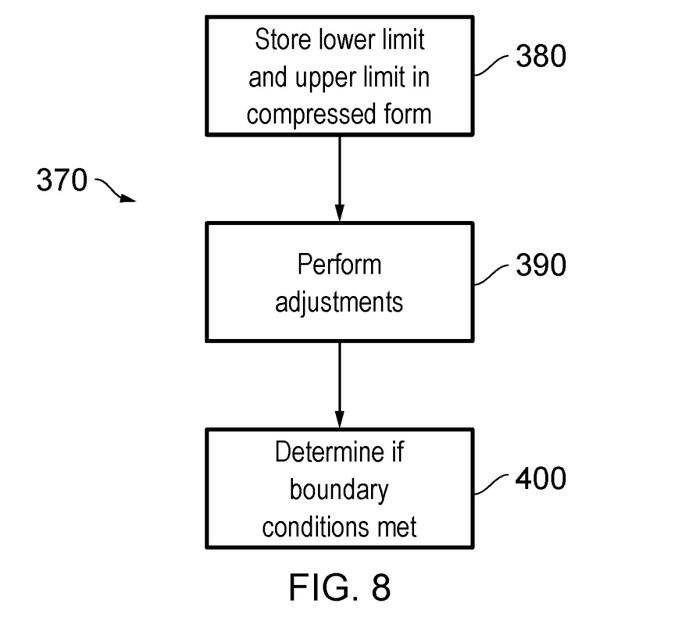
FIG. 8 illustrates a flowchart that illustrates a method of operating a data processing apparatus in accordance with an example embodiment.

FIG. 8 illustrates a flowchart 370 that illustrates a method of operating a data processing apparatus in accordance with one embodiment. At a step 380, a lower limit and upper limit are stored in a compressed form. This storage could take place in a register, or could be stored as part of an instruction, for example. The compressed form could involve the use of a mantissa and exponent, for instance. Then, at step 390, adjustments are performed on those values in compressed form. For instance, this could involve adjusting the mantissa values. Finally, at step 400, the adjusted values are used to perform a boundary check. The boundary check has the equivalent effect of determining whether a value falls within the boundary defined by the lower limit and the upper limit. However, the determination of the boundary conditions is achieved without decompressing the upper limit and lower limit.

Accordingly, the present techniques have been shown to make it possible to perform boundary checking using limits that are expressed in a compressed form. Advantageously, this means that the circuitry area can be reduced, and the number and complexity of the operations to be performed can be reduced as compared to a situation when the boundaries are expressed in a full uncompressed form.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A data processing apparatus to perform a determination of whether a value falls within a boundary defined by a lower limit between 0 and $2^m$ and an upper limit between 0 and $2^m$, comprising:
   storage circuitry to store each of said lower limit and said upper limit in a compressed form as a mantissa of q<m bits and a shared exponent e, wherein a most significant m-q-e bits of said lower limit and said upper limit are equal to a most significant m-q-e bits of said value;
   adjustment circuitry to perform adjustments to said lower limit and said upper limit in compressed form; and
   boundary comparison circuitry to perform said determination on said value using said lower limit and said upper limit in said compressed form,
   wherein said determination is to determine whether a memory access using a memory pointer having said value is within a memory region bounded by a lower address and an upper address having values of said lower limit and said upper limit, respectively.

2. A data processing apparatus according to claim 1, wherein
   said storage circuitry is configured to store a base; and
   said value is derived by adding together said base and an offset.

3. A data processing apparatus according to claim 1, wherein
   said boundary comparison circuitry performs said determination using boundary wrapping with (q+1) bits of said value, said lower limit, and said upper limit.

4. A data processing apparatus according to claim 1, wherein
said adjustment circuitry is configured to determine a mantissa of said value by right shifting said value based on said exponent and then taking a least significant q bits.

5. A data processing apparatus according to claim 4, wherein
said adjustment circuitry is configured to perform one or more of said adjustments in response to a determination of whether said mantissa of said lower limit, said mantissa of said upper limit, and said mantissa of said value are all within $2^{q+e}$ of each other.

6. A data processing apparatus according to claim 5, wherein
said determination is made by considering a window of $2^{q+e}$ contiguous values starting at a representative value less than said mantissa of said lower limit.

7. A data processing apparatus according to claim 6, wherein
said representative value is equal to said mantissa of said lower limit minus $2^{12}$.

8. A data processing apparatus according to claim 6, wherein
said adjustment circuitry is configured to concatenate a '1' to most significant bits of said mantissa of said value in response to said mantissa of said value being less than said representative value.

9. A data processing apparatus according to claim 6, wherein
said adjustment circuitry is configured to concatenate a '1' to most significant bits of said mantissa of said upper limit in response to said mantissa of said upper limit being less than said representative value.

10. A data processing apparatus according to claim 6, wherein
said adjustment circuitry is configured to concatenate a '1' to most significant bits of said mantissa of said lower limit in response to said mantissa of said lower limit being less than said representative value.

11. A data processing apparatus according to claim 4, wherein
said adjustment circuitry is configured to increment or decrement at least one of said mantissa of said lower limit, said mantissa of said upper limit, and said mantissa of said value such that said mantissa of said lower limit, said mantissa of said upper limit, and said mantissa of said value are all within $2^{q+e}$ of each other.

12. A data processing apparatus according to claim 11, wherein
said adjustment circuitry is configured to increment or decrement at least one of said mantissa of said lower limit, said mantissa of said upper limit, and said mantissa of said value by $2^{q+e}$.

13. A data processing apparatus according to claim 11, wherein
said adjustment circuitry is configured to increment at least one of said mantissa of said lower limit, said mantissa of said upper limit, and said mantissa of said value by performing a concatenation on at least one of said mantissa of said lower limit, said mantissa of said upper limit, and said mantissa of said value.

14. A data processing apparatus according to claim 13, wherein
said concatenation is of a value '1' at a most significant position, such that said concatenation is equivalent to adding $2^{q+e}$.

15. A data processing apparatus according to claim 4, wherein
said adjustment circuitry is configured to increment at least one of said mantissa of said lower limit, said mantissa of said upper limit, and said mantissa of said value such that said mantissa of said lower limit, said mantissa of said upper limit, and said mantissa of said value are all within $2^{q+e}$ of each other.

16. A data processing apparatus according to claim 4, wherein
said storage circuitry is configured to store a base;
said value is derived by adding together said base and an offset;
said adjustment circuitry is configured to increment said mantissa of said value by 1 in response to said least significant (e−1) bits of adding together said base and said offset producing a carry.

17. A data processing apparatus according to claim 1, wherein
said boundary comparison circuitry comprises:
edge-case circuitry to indicate that said value falls outside said boundary in response to one or more edge-case conditions; and
mantissa comparison circuitry to indicate whether said value falls within said boundary based on said mantissa of said value being less than said mantissa of said lower limit or greater than said mantissa of said upper limit after said adjustments have been performed.

18. A data processing apparatus according to claim 17, wherein
said storage circuitry is configured to store a base;
said value is derived by adding together said base and an offset;
said edge-case conditions comprises a condition that most significant (m-e-q) bits of said offset contain at least one '1' and at least one '0'.

19. A data processing apparatus according to claim 1, wherein
said data processing apparatus operates in two or fewer processor cycles.

20. A method of operating a data processing apparatus to perform a determination of whether a value falls within a boundary defined by a lower limit between 0 and $2^m$ and an upper limit between 0 and $2^m$, comprising:
storing each of said lower limit and said upper limit in a compressed form as a mantissa of q<m bits and a shared exponent e, wherein a most significant m-q-e bits of said lower limit and said upper limit are equal to a most significant m-q-e bits of said value;
performing adjustments to said lower limit and said upper limit in compressed form; and
performing said determination on said value using said lower limit and said upper limit in said compressed form,
wherein said determination is to determine whether a memory access using a memory pointer having said value is within a memory region bounded by a lower address and an upper address having values of said lower limit and said upper limit, respectively.

21. A data processing apparatus to perform a determination of whether a value falls within a boundary defined by a lower limit between 0 and $2^m$ and an upper limit between 0 and $2^m$, comprising:
means for storing each of said lower limit and said upper limit in a compressed form as a mantissa of q<m bits and a shared exponent e, wherein a most significant m-q-e bits of said lower limit and said upper limit are equal to a most significant m-q-e bits of said value;

means for performing adjustments to said lower limit and said upper limit in compressed form; and means for performing said determination on said value using said lower limit and said upper limit in said compressed form, wherein said determination is to determine whether a memory access using a memory pointer having said value is within a memory region bounded by a lower address and an upper address having values of said lower limit and said upper limit, respectively.

\* \* \* \* \*